United States Patent [19]

Okabayashi

[11] Patent Number: 5,262,042

[45] Date of Patent: Nov. 16, 1993

[54] SIMPLIFIED METHOD FOR DIRECT ELECTROPLATING OF DIELECTRIC SUBSTRATES

[75] Inventor: Kiyoshi Okabayashi, Tokyo, Japan

[73] Assignee: Eric F. Harnden, Redlands, Calif.

[21] Appl. No.: 806,875

[22] Filed: Dec. 12, 1991

[51] Int. Cl.$^5$ ............................................. C25D 5/54
[52] U.S. Cl. ..................................... 205/210; 205/125; 205/167; 205/187; 427/301
[58] Field of Search .................. 205/125, 167, 187; 427/210, 301

[56] References Cited

U.S. PATENT DOCUMENTS

| | | | |
|---|---|---|---|
| 3,099,608 | 7/1963 | Radovsky et al. | 205/184 |
| 3,904,792 | 9/1975 | Gulla et al. | 427/304 |
| 3,961,109 | 6/1976 | Kremer et al. | 427/304 |
| 3,993,802 | 11/1976 | Polichette | 427/98 |
| 4,008,343 | 2/1977 | Cohen et al. | 427/98 |
| 4,061,588 | 12/1977 | Gulla | 427/98 |
| 4,448,804 | 5/1984 | Amelio et al. | 427/98 |
| 4,481,236 | 11/1984 | Forsterling | 427/98 |
| 4,604,299 | 8/1986 | Deluca et al. | 427/98 |
| 4,683,036 | 7/1987 | Morrissey et al. | 205/125 |
| 4,810,333 | 3/1989 | Gulla et al. | 205/166 |
| 4,891,069 | 1/1990 | Holtzman et al. | 205/125 |
| 4,933,010 | 6/1990 | Okabayashi | 106/1.11 |

FOREIGN PATENT DOCUMENTS

| | | |
|---|---|---|
| 0298298 | 1/1989 | European Pat. Off. . |
| 2123036 | 1/1984 | United Kingdom . |

Primary Examiner—John Niebling
Assistant Examiner—Kishor Mayerkar
Attorney, Agent, or Firm—Poms, Smith, Lande & Rose

[57] ABSTRACT

Improved methods for electroplating non-conducting substrates are disclosed utilizing aqueous saline adhesion promoter solutions and rinse solutions to enhance the surface deposition of colloidal metal activating catalysts to form conducting layers capable of direct electroplating. One variation of the process recycles excess activating catalyst into the aqueous saline adhesion promoter to eliminate waste.

11 Claims, No Drawings

SIMPLIFIED METHOD FOR DIRECT ELECTROPLATING OF DIELECTRIC SUBSTRATES

BACKGROUND OF THE INVENTION

1. Field of the Invention

The present invention is directed to improved methods for directly electroplating conducting metals onto nonconducting or dielectric base materials. More particularly, the present invention is directed to reduced cost, reduced toxicity, streamlined methods for directly electroplating metals onto the surfaces of nonconducting substrates without the need for preliminary electroless plating, strongly oxidizing adhesive promoters, exotic activation catalysts, conversion coatings, or conducting clips to initiate the propagation of plating metal. The methods of the present invention are particularly applicable to multi-layer laminated circuit boards, copper clad substrates, molded circuitry, and non-clad substrates. Additionally, the methods of the present invention can be readily incorporated into pattern plating processes.

2. Description of the Prior Art

In the past decade a number of methods have been developed for "directly" electroplating metals onto the surfaces of non-metallic or dielectric substrates. Prior to these developments, non-metallic surfaces were typically metallized or plated by first making the surfaces catalytically receptive to electroless metal deposition by treatment with an activation catalyst (usually an acid suspension of palladium and tin salts) followed by treatment of the catalyzed surfaces in chemical plating baths. These electroless or chemical plating steps form a metal layer having a sufficient thickness to support subsequent electroplating steps which build a layer of electroplated metal having the desired thickness and conductivity. Unfortunately, these traditional multi-step electroless metal plating processes require careful monitoring by highly trained operators because of their use of formaldehyde, complexity and sensitivity to chemical changes in the various solutions and plating baths. In spite of this complexity and expense early electroless plating processes continue to be of use, particularly in the manufacture of printed circuit boards.

Subsequent efforts directed toward eliminating the complexity and expense associated with preliminary electroless plating steps have met with varied levels of success. For example, Morrissey et al., U.S. Pat. No. 4,683,036 report a method for directly electroplating non-metallic surfaces by forming a plurality of metallic sites on the surface to be plated, providing that surface with a connector electrode, exposing the metallized surface and at least a portion of the connector electrode to an electroplating bath incorporating plating metal and a variety of preferential deposition additives including dyes, surfactants, chelating agents, brighteners and leveling agents and applying an electric potential to the connector electrode and a counter electrode in the plating bath.

Though reportedly effective at the direct electroplating of metals onto nonconducting surfaces, the method of Morrissey et al. also requires its own careful monitoring and control of plating bath chemistry and plating potential in order to obtain uniform metallization. Moreover, to compensate for the lack of a preliminary electroless metal layer Morrissey et al. rely on a wide variety of relatively toxic plating additives to achieve preferential metal deposition in their plating baths. These materials add to the complexity, toxicity and waste elimination expenses associated with such processes. Further, because the catalytically deposited discrete metallic sites are not sufficiently conductive to support direct electroplating on their own a conducting "connector electrode" is required in conjunction with the metalized surface to initiate plating.

Morrissey et al. also report it advantageous to further treat the catalytically activated surface with an acidic or strongly basic solution in order to remove tin from the treated surface prior to electroplating. As with earlier electroless plating methodologies, these acidic or strongly basic accelerating solutions add to the expense, toxicity, and disposal problems associated with these plating techniques.

In an analogous development, recent efforts at improving the speed and quality of metallic plating processes have utilized strongly oxidizing adhesion promoter solutions to enhance the catalytic activation of dielectric surfaces prior to chemical or electroplating. Typically, these adhesion promoters are formed of aqueous solutions containing compounds such as potassium permanganate. These solutions oxidize the substrate surfaces in a preliminary treatment step prior to catalytic activation with the precious metal/tin catalyst. Though successful for these purposes, as with the previously discussed accelerating solutions, these strongly oxidizing adhesion promoters are difficult to utilize and dispose of in a safe and environmentally conscious manner.

Accordingly, it is a principle object of the present invention to provide methods for directly electroplating dielectric substrates with high quality, uniform, conducting metal layers that are simple to operate, inexpensive, and relatively non-toxic. The methods of the present invention are particularly applicable to the production of printed circuit boards having copper clad conductive surfaces on opposite sides of an insulating dielectric substrate and connected by plated "through holes".

It is an additional object of the present invention to provide novel, low cost adhesion promoters that are non-hazardous, highly effective, and inexpensive to produce utilize, and store.

It is a further object of the present invention to provide methods for the direct electroplating of non-conducting substrates that are particularly well suited for utilization in modern pattern plating processes and, of equal importance, operate without the need for high plating current densities and correspondingly large "through hole" diameters.

It is a further additional object of the present invention to provide high quality treated dielectric substrates and directly plated dielectric substrates.

SUMMARY OF THE INVENTION

Generally stated, these and other objectives are accomplished by the present invention through the utilization of reduced complexity, highly efficient, reduced toxicity direct electroplating processes incorporating novel saline adhesion promoter and rinse solutions in place of the strongly oxidizing adhesion promoters of the prior art.

Before proceeding further it should be emphasized that these saline adhesion promoter solutions and rinse solutions are equally applicable to electroless plating as well. However, for purposes of explanation these solutions will be discussed in the context of direct electroplating techniques. Thus, in their broadest aspect, the direct electroplating methods of the present invention generally comprise the following steps.

First, a dielectric substrate to be plated is treated with an adhesion promoter solution formed of aqueous sodium chloride or equivalent salt and a dilute concentration of noble or precious metal and tin activation catalyst. This is followed by treatment with a cleaner or cleaner/conditioner solution which may be followed by an optional pre-dip treatment to prevent subsequent contamination of the activation catalyst solution. The conditioned substrate is then treated with an activation catalyst, preferably a micro-fine colloidal dispersion of a noble or precious metal and tin in an aqueous salt solution such as that disclosed in U.S. Pat. No. 4,933,010. The catalytically activated substrate is then rinsed in an aqueous salt solution equivalent to the pre-dip solution in order to remove any excess catalyst remaining on the substrate surfaces.

Unlike the prior art plating methodologies, rather than disposing of this excess catalyst containing rinse solution, the present invention methodologies recycle this solution for utilization as the previously discussed adhesion promoter. Thus, in addition to eliminating the toxicity associated with prior art oxidizing adhesion promoters, the present invention also eliminates waste and substantially reduces the expense of direct electroplating processes.

The next step involves treatment of the activated substrate with a mildly basic accelerating solution, preferably containing copper ions as disclosed in co-pending, U.S. patent application Ser. No. 718,186, filed Jun. 20, 1991. Following acceleration the treated substrate may go directly to electroplating or, alternatively, may be stabilized in a sulfuric acid bath for storage or subsequent pattern plating treatment as known in the art.

In practice, the improved methods of the present invention function to produce highly conductive catalytic metal layers that will support direct electroplating without the need for conversion coatings, conducting clips or other plating propagation techniques. For example, the average electrical resistance measured across a catalytically treated dielectric substrate "through hole" utilizing the methods of the prior art ranges from 10,000 to 30,000 ohms. In contrast, utilizing the methodology of the present invention the measured "through hole" resistance may be as low as 100 ohms. Thus, average electrical resistance measured from side to side on a multi-hole catalytically treated substrate can be as low as 0.2 ohms utilizing the methods of the present invention as opposed to an average of 500 ohms to $8 \times 10^7$ ohms through the methods of the prior art.

Based upon electrical conductivity alone, it is clear that the methods of the present invention produce significantly more dense, uniform, and complete conducting catalytic layers which, as a result, greatly enhance the speed and quality of subsequent electroplated metal layers. These quality benefits are achieved in conjunction with the previously discussed reduction in toxicity, waste and expense achieved through the methods of the present invention which recycle excess catalyst for use as novel saline adhesion promoters.

It should be emphasized that while the micro-fine colloidal catalysts mentioned are preferred, the methods of the present invention are suitable for use with any quality noble or precious metal catalyst. Similarly, a wide variety of commercially available cleaner/conditioner solutions may be utilized to practice the present invention. This broad based applicability makes the methods of the present invention and the associated adhesion promoter solutions readily adaptable to existing plating processes and equipment.

Further objects, features and advantages of the present invention will become apparent to those skilled in the art from a consideration of the following detailed description.

DETAILED DESCRIPTION OF THE INVENTION

Those skilled in the art will appreciate that sensitizing activator solutions of catalytic noble or precious metals are used in a wide variety of electroless and direct electroplating metal techniques. Thus, in a broad aspect, the present invention provides methods for significantly enhancing the effectiveness, stability and durability of these sensitizing activator solutions to easily and effectively produce conducting catalytic layers on treated dielectric substrates which enable the treated substrates to be electroplated directly. Where prior art efforts have been focused on improving the catalyst itself or on subsequently treating the catalytically activated substrate surfaces to achieve these goals, the methods of the present invention advantageously pre-treat the dielectric substrate surfaces to significantly improve the adhesion of the catalytic sensitizing activator thereby eliminating the need for costly and difficult subsequent treating steps. Thus, the present invention is able to produce previously unobtainable levels of conductivity in the conducting catalyst layers deposited on the dielectric substrates to be plated in a simple, efficient and inexpensive manner.

Of equal importance, the present invention accomplishes these results while simultaneously eliminating previously used toxic or hazardous materials such as formaldehyde and permanganate as well as also eliminating waste and the associated expenses. This is accomplished through its utilization of novel saline adhesion promoters which enhance the adsorption and dispersion of cleaner conditioners on the surfaces of the dielectric substrates prior to treatment with the sensitizing activator. The saline adhesion promoters are non-hazardous, easy to transport, easy to use, and safe to store. Because of their effectiveness, the method of the present invention provides an improved, lower cost electroplating methodology which is widely applicable to dielectric materials including printed circuit boards, functional and decorative plastic components.

Generally speaking, most sensitizing activators solutions rely upon a catalytic noble or precious metal halide salt such as palladium chloride in conjunction with tin chloride to chemically deposit a film of these materials on the surface of the dielectric substrates to be plated. Improvements in these sensitizing activator solutions have generally involved the elimination of acids which may attack the black copper oxide layers of printed circuit boards and in the production of micro-fine, uniform colloidal distributions of the catalytic particles to produce more uniform and complete catalytically deposited layers.

As mentioned previously, exemplary catalytic sensitizing activator solutions suitable for practicing the present invention are the general subject matter of the Inventor's prior U.S. Pat. No. 4,933,010. Methods for their utilization in direct electroplating also are disclosed and claimed in the Inventor's U.S. Pat. No. 5,071,517. Subsequent improvements to these methodologies are disclosed and claimed in the Inventor's copending U.S. patent application Ser. No. 718,186 filed Jun. 20, 1991, the subject matter of which are incorporated herein by reference.

Thus, while a wide variety of activating catalyst solutions may be utilized to practice the present invention, a preferred exemplary catalyst solution is formed as follows. Preferably, a non-acidic saturated aqueous salt solution of sodium chloride or alternative halide salt will be divided into two portions. An effective amount of a noble or precious metal salt such as palladium chloride will be dissolved in the first portion and a relative molar excess of stannous chloride or other halide salt will be dissolved in the second portion. The two solutions so produced are combined and reduced in volume to form a supersaturated concentrate of highly dispersed, uniform, stable micro-fine colloidal particles.

More specifically, to form the initial saturated aqueous salt solution approximately 1 Kg of sodium chloride is added to 3 liters of water and heated to approximately 60° C. to form a saturated salt solution. Next, 1 Kg of stannous chloride crystals are mixed with a sufficient volume of this saturated salt solution to form 1.9 liters. If necessary, this solution may be heated to approximately 20° C. to 30° C. with occasional stirring to achieve complete dissolution. In a separate container, 20 g of powered palladium chloride is added to 200 ml of the saturated salt solution. This solution is heated and stirred at a temperature between about 40° C. to 60° C. until complete dissolution of the palladium chloride is achieved. The dissolved palladium chloride salt solution is added to the stannous chloride salt solution with stirring and heat to raise the temperature to approximately 80° C. This temperature is maintained for approximately 1 hour to evaporate anywhere from 5% to 10% of the solution to create a supersaturated solution. This produces approximately two liters of micro-fine colloidal sensitizing activator.

It again should be emphasized that alternative catalytic solutions are contemplated for use within the scope of the present invention. For example, an aromatic aldehyde such as lignin vanillin may be incorporated into the catalyst solution to prevent the palladium/tin colloids from agglomerating or coagulating and to enhance the adsorption characteristics of the solution. Alternatively, effective commercially available catalysts are available from MacDermid, Shipley, M&T Harshaw, and Enthone OMI as well as others.

The micro-fine catalytic colloidal solutions are preferably diluted prior to use as known in the art. Exemplary dilution factors range from approximately 10 to 1 to 30 to 1. Preferably, the previously discussed micro-fine catalytic colloidal solution will be diluted on the order of 10 to 1 in saturated salt solution. While no other additives or stabilizers are needed a small amount of HCl (approximately 4 ml) or $H_2SO_4$ (approximately 0.5 ml) may be added to prevent the formation of an oxidized tin layer on the surface of the solution.

Utilizing the exemplary or substantially equivalent catalytic sensitizing activator solutions, the methods of the present invention generally include the following steps. First, a suitable dielectric substrate is prepared for plating. For example, typical non-conducting substrate materials known in the art which are suitable for use in conjunction with the present invention include plastics, resins, and epoxy materials such the glass fiber filled epoxy substrates commonly used in the manufacture of printed circuit boards. As known in the art, it is preferred that the non-conducting substrates be clean and free of rough edges.

The exemplary substrate is then treated with a saline adhesion promoter in accordance with the teachings of the present invention. Preferably, the saline adhesion promoter solution is formed by diluting a portion of the previously discussed concentrated catalyst solution by a factor on the order of 100 to 1 with an aqueous salt solution. The adhesion promoter bath so produced is extremely stable and operates over a wide range of temperatures and treatment times.

Additionally, in accordance with the teachings of the present invention, because the saline adhesion promoter solution is substantially identical to the catalyst solution in constituent composition it may be made by capturing the "drag out" solution from the subsequent activator rinse step, as will be discussed in detail below. Thus, once the proper concentration of activator has been established in the activator rinse step the solution may be recycled into the adhesion promoter tanks. In so doing the overall operating cost of the process is significantly reduced with no loss in plating quality. Regardless of how the saline adhesion promoter solution is produced, treatment of the substrate simply involves immersing the substrate into the solution with agitation at room temperature or above for a period of time ranging from approximately 1 to 10 minutes, preferably followed by a brief rinse with distilled or deionized water.

In contrast to the strongly oxidizing prior art adhesion promoters which reportedly functioned to chemically expose clean substrate surfaces for conditioning, the gentle, non-toxic saline adhesion promoters of the present invention are believed to function by adsorbing a small portion of the activating catalyst colloids onto the substrate surfaces prior to conditioning. Thus, in the same manner that the cleaner conditioners are believed to enhance the adsorption of the catalytic colloids on to the substrate surfaces, the adhesion promoters of the present invention are believed to deposit catalytic colloids on the surfaces as a preliminary step to enhance the subsequent deposition of the cleaner/conditioner. This treatment significantly improves the operation of the cleaner/conditioner and, as a result, enhances the adsorption of the subsequently deposited catalytic activator. This, in turn, significantly improves the conductivity of the deposited catalytic film beyond that of prior art adhesion promoters. Additionally, as previously mentioned, the saline adhesion promoters of the present invention are safe, simple, and easy to use, transport and store because of their relatively low toxicity.

Thus, the next step following adhesion promotion involves taking the adhesion promoted substrate and treating it with a conditioner solution, also known as a cleaner/conditioner. A wide variety of cleaner/conditioner agents and solutions known in the art are suitable for practicing the present invention. Exemplary conditioners are available from Shipley, Lion Chemical Company Ltd. of Japan and M&T Harshaw. The cleaners function to remove any light oxide layers and contaminates such as finger prints from the surface of the dielectric substrates and function as surfactants which adhere to the surfaces of the substrates. Reportedly, they slightly solubilize the catalytic colloids in the subsequent steps, attracting the colloidal particles to the surfaces of the substrate, thereby encouraging the colloids to adsorb more readily onto the treated substrate surfaces. As with the previous adhesion promoter treatment step, treatment with the cleaner/conditioner simply involves immersion of the substrate into a solution of the cleaner/conditioner with agitation at room temperature or above for a period of up to 10 minutes followed by a 2 minute rinse in distilled or deionized water.

The methods of the present invention again differ from those of the prior art by manipulating the cleaner/conditioner step with a unique salt water rinse technique. This alternative methodology functions to prevent excessive removal of the cleaner/conditioner from the surfaces of the treated substrate. In some circumstances this step is so effective at enhancing catalytic deposition that it is possible to practice the method of the present invention without utilizing the previously discussed saline adhesion promoter step, as long as the cleaner/conditioner is properly treated. Thus, rather than rinsing the cleaner/conditioner treated substrates with distilled or deionized water, in accordance with the teachings of the present invention the substrates may be rinsed in a 10% by weight NaCl solution which is less effective at removing the cleaner/conditioner. This simple manipulation of the cleaner/conditioner step unexpectedly increases the adsorption of the colloidal catalyst.

The next step in the present invention is to immerse the conditioned substrates in a pre-dip solution to avoid contamination of the subsequent catalyst bath. It should be noted, that this pre-dip step is not essential to the practice of the present invention but is preferable as it enhances the longevity of the catalyst solution. Preferably, the pre-dip solution will be substantially identical to the carrier solution for the colloidal catalyst, absent the colloidal materials. Thus, where desired, the processing sequence may involve immersion of the substrates in a catalyst pre-dip solution comprising an aqueous salt solution compatible with the catalytic solution such as a dilute NaCl solution incorporating a small concentration of vanillin.

This pre-dip solution prevents contamination of the catalyst by rinse water or other solutions which may cling to the surfaces of the substrate or "through holes" to be catalytically treated. As an added benefit, the presence of vanillin in the pre-dip promotes improved adsorption of the micro-fine colloidal catalyst particles by initiating a partial polarization of the substrate surfaces. Preferably, immersion in the pre-dip solution will take place with agitation at room temperature for a brief period without a following rinse.

The next step involves immersion of the treated substrate with agitation at room temperature or an elevated temperature in the previously discussed sensitizing activator colloidal catalyst solution for a period ranging from approximately 5 to 10 minutes. An exemplary catalytic treatment step in accordance with the teachings of the present invention will utilize the previously discussed catalyst, or its equivalent, at a temperature varying between approximately 35° C. to 55° C. for approximately 7 minutes. This produces a very uniform layer of deposited colloidal material of considerably higher density and electrical conductivity than previously obtainable through prior art methodologies.

Further, to enhance the economies of the present methodology, rather than simply rinsing the treated substrate with distilled or deionized water for 1 or 2 minutes, it is preferred that the treated substrate be rinsed with salt water or pre-dip like solution to pull off any excess catalyst that may be adhering to the surfaces of the substrate. These excess catalytic colloids, combined with the saline bath then may be used as the previously discussed adhesion promoter for subsequent substrates. Thus, in effect, the adhesion promoter step simply involves immersing the substrates into a diluted portion of spent activator solution, significantly improving the economies of these processes by eliminating waste. Preferably, this "drag out" step will be followed by conventional rinsing with distilled or deionized water.

The more uniform, dense layer of catalytic colloid so produced preferably is accelerated using an alkaline copper accelerator as taught in the Inventor's co-pending U.S. patent application Ser. No. 718,186, filed Jun. 20, 1991 to form a more highly conductive catalytic metal film. For example, exemplary mildly basic accelerating solutions can be formed by dissolving anywhere from 50 g to 400 g of alkaline salts such as NaOH, KOH, $Na_2CO_3$, or $K_2CO_3$ per liter of distilled water. Then, to each liter of this solution approximately 2 ml of copper ion containing solution formed by dissolving approximately 100 g of $CuSO_4$ in one liter of 10% $H_2SO_4$ is added. Treatment of the catalyzed substrate simply involves immersion in a bath of the accelerator solution with agitation at an elevated temperature of approximately 50° C. for a period of approximately 10 minutes. Following acceleration the substrate should be rinsed with distilled or deionized water for 1 or 2 minutes.

If desired, the accelerated substrate can be stabilized through immersion with agitation at room temperature in a 10% by volume aqueous solution of $H_2SO_4$ for approximately 3 minutes followed by a 2 minute rinse with distilled or deionized water and air drying. Other acids such as methane sulfonic acid may be used for this purpose as well. Though not essential to the practice of the present invention, this acid bath will stabilize the substrate by hardening the catalyst layer and preventing its subsequent oxidation. After stabilization the treated substrates can be manipulated and stored for considerable periods of time without difficulty. Nonetheless, it should be emphasized that sulfuric acid stabilization is an alternative step and is not essential to the practice of the present invention.

As previously noted, the method of the present invention produces relatively highly conductive deposited layers of micro-fine catalytic colloidal metal which can be directly electroplated with a layer of conducting metal without the need for conventional electroless plating, conversion coatings or plating solution additives. Additionally, electroplating current densities can be reduced in accordance with the teachings of the present invention which enhances the quality of the metal plating.

Thus, following acceleration the treated substrate may be plated using a simple plating solution without the need for solution additives. This puts a softer copper deposit on the electroplated substrate.

An exemplary plating solution can be produced by dissolving 80 g copper sulfate with 180 g of sulfuric acid and 30 mg chlorine into each liter of distilled or deionized water. This produces a typical copper electroplating solution comprising an aqueous acid solution of the metal to be plated. Naturally, the present invention is applicable to metals other than copper as known in the art.

As an added benefit of the resultant reduced current densities needed to conduct metal plating of these treated substrates, the substrates produced by the present invention may have unusually small "through hole" diameters without sacrificing plating quality or conductivity. In all other aspects electroplating the treated substrates of the present invention is generally conventional. Thus, the exemplary plating baths can be maintained at temperatures ranging from approximately 25° C. to 30° C. Further, electroplating should be continued for a sufficient period of time to deposit the desired thickness of plating metal, typically ranging from approximately 0.5 mils to 2.0 mils. Plating times ranging from several minutes to over 1 hour are usually sufficient.

A further understanding of the present invention will be provided to those skilled in the art from a consideration of the following non-limiting examples. These examples were designed to illustrate the competitive advantages of the methods of the present invention over those of the prior art. In all examples four-layer polyamide circuit board material was utilized. Each sample had 100 through holes of approximately mm diameter drilled through it followed by a desmearing process consisting of immersion in a heated bath of concentrated sulfuric acid and hydrogen peroxide. Each specimen was cut to a standard size measuring 2.5 cm by 5.0 cm and approximately 2 mm in thickness. Edges were polished to produce a relatively uniform smoothness.

EXAMPLE 1

Direct Plating a Copper Clad Multi-Layer Circuit Board Using Prior Art Strongly Alkaline, Strong Oxidizer Adhesion Promoter and Highly Chelated Cleaner Conditioner In order to provide a baseline comparison of the prior art methodologies for direct plating four specimens were treated using the following basic procedure of consecutive steps.

Step 1. Each sample was immersed with agitation at room temperature for 2 minutes in an adhesion promoter solution formed of 30 g $KmNO_4$ with 20 g NaOH per liter in deionized water followed by a 2 minute rinse in running deionized water.

Step 2. Each sample was immersed with agitation for 10 minutes in a cleaner/conditioner solution of Shipley 1175A cleaner conditioner at 4% concentration and heated to 80° C. for 10 minutes followed by a 2 minute rinse in running deionized water.

Step 3. Each sample was immersed with agitation at room temperature in a pre-dip solution of saturated NaCl in water including 1 g vanillin and 4 ml HCl per liter with no subsequent rinsing.

Step 4. Each sample was immersed with agitation for 7 minutes in a colloidal catalyst formed from Solution Technology Systems HN504 TM Acid-Free TM catalyst at 5% concentration using a carrier solution of the same composition as the pre-dip described in Step 3 and heated to 40° C. followed by a 2 minute rinse with deionized water.

Step 5. Each sample was immersed with agitation for 10 minutes in an alkaline accelerator solution formed of Solution Technology System HN505.1 TM consisting of a mixture of $Na_2CO_3$ and $K_2CO_3$ in deionized water including 4 ml of Solution Technology Systems HN505.2 TM Kick-Start TM as a source of copper ions and heated to 58° C. followed by a 2 minute rinse in deionized water.

Step 6. Each sample was immersed with agitation at room temperature for 3 minutes in a 10% by volume sulfuric acid bath followed by a 2 minute rinse with deionized water and air drying.

Step 7. The resistance was measured for each specimen by placing one probe of an ohm meter on the copper foil of one side of each specimen and the other probe on the foil of the opposite side. The average resistance value for each specimen was measured at 2,000 ohms per "through hole".

Step 8. Each specimen was plated for 1 hour using a simple copper sulfate bath as described above at 2 amps per square decimeter. Surface coverage was observed to be complete after 10 seconds with no observable voids and all edges completely plated.

EXAMPLE 2

Direct Plating Copper Clad Multi-Layer Circuit Board Using Prior Art Strongly Alkaline, Strong Oxidizer Adhesion Promoter and Mildly Chelated Cleaner Conditioner To provide an additional prior art baseline comparison four specimens were treated using the same procedure as in Example 1 with the following modifications to the indicated steps and associated results.

Step 2. The cleaner/conditioner was made up at 4% concentration from Laol conditioner produced by Lion Chemical Co. Ltd.

Step 7. The average resistance was measured per "through hole" at 1,863 ohms.

Step 8. The specimens were plated under the same conditions as in Example 1 and surface coverage was observed to be complete after 10 seconds with no observable voids.

EXAMPLE 3

Direct Plating Copper Clad Multi-Layer Circuit Board Using Prior Art Strongly Alkaline, Strong Oxidizer Adhesion Promoter and Cleaner Conditioner To provide an additional prior art baseline comparison four specimens treated using the same procedure as in Example 1 with the following modifications to the indicated steps and associated results.

Step 2. The cleaner/conditioner was made up at 4% concentration from M&T Harshaw's CC350.

Step 7. The average resistance was measured per "through hole" at 8,000 ohms.

Step 8. The specimens were plated under the same conditions and surface coverage was observed to be complete after 35 seconds. Voids were observable on glass bundles projecting into the "through holes" and unplated areas were present on the specimen edges.

EXAMPLE 4

Direct Plating Copper Clad Multi-Layer Circuit Board Using Prior Art Strongly Alkaline, Strong Oxidizer Adhesion Promoter with a Highly Chelated Cleaner Conditioner and Followed by a Salt Water Rinse In order to illustrate the ability of the methods of the present invention to increase the adsorption of catalyst through manipulation of the cleaner/conditioner step with a novel salt water rinse, four additional specimens were treated as in Example 1 with the following modifications to the indicated steps and associated results.

Step 2. Following immersion in the Shipley 1175A cleaner/conditioner the specimens were rinsed in a 10% by weight NaCl solution instead of deionized water.

Step 7. The average resistance was measured per "through hole" at 150 ohms.

Step 8. The specimens were plated under the same conditions and surface coverage was observed to be complete after 5 seconds with no observable voids and all edges completely plated.

EXAMPLE 5

Direct Plating Copper Clad Multi-Layer Circuit Board Using Novel Saline Adhesion Promoter and Prior Art Highly Chelated Cleaner Conditioner In order to illustrate the superior performance achieved through the method of the present invention an additional four specimens were treated using the methodology of Example 1 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 900 ohms.

Step 8. The specimens were plated under the same conditions and surface coverage was observed to be complete after 5 seconds with no observable voids.

EXAMPLE 6

Direct Plating Copper Clad Multi-Layer Circuit Board Using Novel Saline Adhesion Promoter and Prior Art Mildly Chelated Cleaner Conditioner To contrast the performance of the method of the present invention to the prior art illustrated in Example 2, four additional specimens were treated as in Example 2 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 770 ohms.

Step 8. The specimens were plated under the same conditions and surface coverage was observed to be complete after 2 seconds with no observable voids.

EXAMPLE 7

Direct Plating Copper Clad Multi-Layer Circuit Board Using Novel Saline Adhesion Promoter and Prior Art Cleaner Conditioner To contrast the performance of the method of the present invention to the prior art illustrated in Example 3, four additional specimens were treated as in Example 3 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 1,340 ohms.

Step 8. The specimens were plated under the same conditions and surface coverage was observed to be complete after 10 seconds with no observable voids.

EXAMPLE 8

Using Novel Saline Adhesion Promoter and Prior Art Mildly Chelated Cleaner Conditioner Followed by Salt Water Rinse To contrast the performance of the method of the present invention to the prior art illustrated in Example 4, four additional specimens were treated as in Example 4 with the following modifications to the indicated steps and associated results.

Step 1. The adhesion promoter comprised a 1% solution of the catalyst from Step 4 diluted using a carrier solution equivalent to the pre-dip of Step 3. The bath was not heated.

Step 7. The average resistance was measured per "through hole" at 120 ohms.

Step 8. The specimens were plated under the same conditions and surface coverage was observed to be complete after 2.5 seconds with no observable voids.

EXAMPLE 9

Direct Plating an Unclad ABS Plastic Plaque Using Novel Saline Adhesion Promoter and Prior Art Highly Chelated Cleaner Conditioner To further illustrate the applicability of the method of the present invention to plating a variety of substrates including non-clad plastics, four ABS plastic plaques measuring 5 cm × 10 cm and approximately 3 mm thick were treated as described in Example 5, with the following modifications to steps 1 and 2.

Step 1. Immersion in the adhesion promoter solution was preceded by etching the plastic in a mixture of chrome/sulfuric acid to form a slightly roughened surface for the plated metal to adhere to.

Step 2. The cleaner/conditioner bath was heated to only 70° C. to avoid malformation of the plastic from excessive heat.

The remaining process step were identical to those of Example 1 with the following results.

Step 7. The average resistance measured 1,020 ohms from side to side.

Step 8. The plaques were plated under the same conditions as Example 1 and initial coverage was completed in less than 25 seconds with no voids.

Having thus described exemplary embodiments of the present invention, it should be noted by those skilled in the art that the disclosures herein are exemplary only and that alternatives, adaptations, and modifications may be made within the scope of the present invention. Accordingly, the present invention is not limited to the specific embodiments illustrated herein.

What is claimed is:

1. An improved, reduced cost method for directly electroplating a metal onto a surface of a non-conducting substrate, said method comprising the steps of:
   treating said surface with an aqueous saline adhesion promoter solution including an effective concentration of catalytic activator;
   conditioning said treated surface with a cleaner/conditioner solution;
   treating said conditioned surface with a colloidal metal catalyst to deposit a substantially uniform, conducting layer of colloidal metal; and
   passing a current between two electrodes immersed in an electrolyte containing dissolved plating metal, one of said electrodes being said catalytically treated substrate.

2. The method of claim 1 wherein said aqueous saline adhesion promoter solution is a substantially saturated aqueous solution of NaCl.

3. The method of claim 2 wherein said aqueous saline adhesion promoter solution further includes a dilute concentration of an aromatic aldehyde.

4. The method of claim 1 further comprising the additional step of rinsing said catalytically treated substrate with an aqueous saline rinse solution to remove any excess colloidal metal catalyst into said aqueous saline rinse solution.

5. The method of claim 4 wherein said aqueous saline adhesion promoter solution comprises said aqueous saline rinse solution containing said colloidal metal catalyst.

6. The method of claim further comprising the additional step of accelerating said catalytically treated surface with a mildly basic aqueous accelerating solution including a concentration of plating metal ions.

7. An improved, reduced cost method for preparing one or more surfaces of a non-conducting substrate for metal plating, said method comprising the steps of:

treating said surface with an aqueous saline adhesion promoter solution including an effective concentration of catalytic activator;

conditioning said treated surface with a cleaner/conditioner solution; and treating said conditioned surface with a colloidal metal catalyst to deposit a substantially uniform, conducting layer of colloidal metal.

8. The method of claim 7 wherein said aqueous saline adhesion promoter solution is a substantially saturated aqueous solution of NaCl.

9. The method of claim 8 wherein said aqueous saline adhesion promoter solution further includes a dilute concentration of an aromatic aldehyde.

10. The method of claim 7 further comprising the additional step of rinsing said catalytically treated substrate with an aqueous saline rinse solution to remove any excess colloidal metal catalyst into said aqueous saline rinse solution.

11. The method of claim 10 wherein said aqueous saline adhesion promoter solution comprises said aqueous saline rinse solution containing said colloidal metal catalyst.

* * * * *

UNITED STATES PATENT AND TRADEMARK OFFICE
CERTIFICATE OF CORRECTION

PATENT NO. : 5,262,042
DATED : Nov. 16, 1993
INVENTOR(S) : KIYOSHI OKABAYASHI

It is certified that error appears in the above-indentified patent and that said Letters Patent is hereby corrected as shown below:

In column 13, line 16, Claim 6, insert --1-- between the words "claim" and "further".

Signed and Sealed this

Nineteenth Day of April, 1994

Attest:

BRUCE LEHMAN

Attesting Officer     Commissioner of Patents and Trademarks